United States Patent
Lin et al.

(10) Patent No.: US 8,741,784 B2
(45) Date of Patent: Jun. 3, 2014

(54) PROCESS FOR FABRICATING SEMICONDUCTOR DEVICE AND METHOD OF FABRICATING METAL OXIDE SEMICONDUCTOR DEVICE

(75) Inventors: Chien-Liang Lin, Taoyuan County (TW); Te-Lin Sun, Kaohsiung (TW); Ying-Wei Yen, Miaoli County (TW); Yu-Ren Wang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 29 days.

(21) Appl. No.: 13/237,232

(22) Filed: Sep. 20, 2011

(65) Prior Publication Data

US 2013/0072028 A1 Mar. 21, 2013

(51) Int. Cl.
*H01L 21/31* (2006.01)
*H01L 21/469* (2006.01)
*H01L 21/02* (2006.01)
*H01L 21/28* (2006.01)
*H01L 21/8238* (2006.01)
*H01L 29/51* (2006.01)

(52) U.S. Cl.
CPC .... *H01L 21/02332* (2013.01); *H01L 21/28185* (2013.01); *H01L 21/28202* (2013.01); *H01L 21/0234* (2013.01); *H01L 21/823857* (2013.01); *H01L 29/518* (2013.01)
USPC ........... 438/776; 438/591; 438/770; 438/775; 438/778; 438/787

(58) Field of Classification Search
CPC .................. H01L 21/28202; H01L 21/28185; H01L 21/02332; H01L 21/823857; H01L 21/0234; H01L 29/518
USPC .................. 438/591, 770, 778, 787, 775, 776
See application file for complete search history.

(56) References Cited

U.S. PATENT DOCUMENTS

| | | |
|---|---|---|
| 5,296,411 A | 3/1994 | Gardner et al. |
| 5,591,681 A | 1/1997 | Wristers et al. |
| 6,043,138 A | 3/2000 | Ibok |
| 6,110,842 A | 8/2000 | Okuno et al. |
| 6,165,846 A | 12/2000 | Carns et al. |
| 6,245,689 B1 | 6/2001 | Hao et al. |
| 6,268,251 B1 | 7/2001 | Zhong et al. |
| 6,358,865 B2 | 3/2002 | Pearce et al. |
| 6,372,605 B1 | 4/2002 | Kuehne et al. |
| 6,461,984 B1 | 10/2002 | Han et al. |
| 6,492,217 B1 | 12/2002 | Bai et al. |
| 6,509,232 B1 | 1/2003 | Kim et al. |
| 6,548,366 B2 | 4/2003 | Niimi et al. |
| 6,590,344 B2 | 7/2003 | Tao et al. |
| 6,627,463 B1 | 9/2003 | Sarfaty |
| 6,632,747 B2 | 10/2003 | Niimi et al. |
| 6,639,264 B1 | 10/2003 | Loh |
| 6,649,538 B1 | 11/2003 | Cheng et al. |
| 6,667,251 B2 | 12/2003 | McFadden et al. |
| 6,670,275 B2 | 12/2003 | Lee et al. |
| 6,706,644 B2 | 3/2004 | Burnham et al. |

(Continued)

Primary Examiner — Bac Au
(74) Attorney, Agent, or Firm — J.C. Patents

(57) ABSTRACT

A process for fabricating a semiconductor device is described. A silicon oxide layer is formed. A nitridation process including at least two steps is performed to nitridate the silicon oxide layer into a silicon oxynitride (SiON) layer. The nitridation process comprises a first nitridation step and a second nitridation step in sequence, wherein the first nitridation step and the second nitridation step are different in the setting of at least one parameter.

12 Claims, 2 Drawing Sheets

(56) References Cited

U.S. PATENT DOCUMENTS

| | | |
|---|---|---|
| 6,723,663 B1 | 4/2004 | Wieczorek et al. |
| 6,737,362 B1 | 5/2004 | Chen et al. |
| 7,030,430 B2 | 4/2006 | Doczy et al. |
| 7,084,025 B2 | 8/2006 | Phua et al. |
| 7,091,119 B2 | 8/2006 | Colombo |
| 7,138,691 B2 | 11/2006 | Burnham et al. |
| 7,153,755 B2 | 12/2006 | Liu et al. |
| 7,176,094 B2 | 2/2007 | Zhong et al. |
| 7,186,608 B2 | 3/2007 | Moore et al. |
| 7,208,366 B2 | 4/2007 | Tsai |
| 7,384,880 B2 | 6/2008 | Brask et al. |
| 7,429,538 B2 | 9/2008 | Olsen |
| 7,521,324 B2 | 4/2009 | Ohmi et al. |
| 7,592,270 B2 | 9/2009 | Teo et al. |
| 7,601,648 B2 | 10/2009 | Chua et al. |
| 7,824,990 B2 | 11/2010 | Chang et al. |
| 2002/0190302 A1 | 12/2002 | Bojarczuk, Jr. et al. |
| 2003/0109146 A1 | 6/2003 | Colombo et al. |
| 2004/0029328 A1 | 2/2004 | Lahaug |
| 2004/0070046 A1 | 4/2004 | Niimi |
| 2005/0003618 A1 | 1/2005 | Kanda |
| 2005/0064109 A1 | 3/2005 | Chen et al. |
| 2005/0202624 A1 | 9/2005 | Li |
| 2006/0148179 A1 | 7/2006 | Wang et al. |
| 2006/0172473 A1 | 8/2006 | Cheng et al. |
| 2006/0172554 A1 | 8/2006 | Wang et al. |
| 2006/0194423 A1 | 8/2006 | Lim et al. |
| 2006/0194446 A1 | 8/2006 | Beaman et al. |
| 2006/0226500 A1 | 10/2006 | Cheng et al. |
| 2006/0246739 A1 | 11/2006 | Wang et al. |
| 2006/0280876 A1 | 12/2006 | Yen et al. |
| 2007/0082445 A1 | 4/2007 | Yang et al. |
| 2007/0082503 A1 | 4/2007 | Wang et al. |
| 2007/0093013 A1 | 4/2007 | Chua et al. |
| 2007/0169696 A1 | 7/2007 | Olsen |
| 2009/0200494 A1 | 8/2009 | Hatem et al. |
| 2009/0289284 A1 | 11/2009 | Goh et al. |
| 2010/0075507 A1 | 3/2010 | Chang et al. |
| 2010/0093142 A1* | 4/2010 | Ho et al. ............. 438/261 |
| 2010/0184281 A1 | 7/2010 | Hsu et al. |
| 2010/0230757 A1 | 9/2010 | Chen et al. |

* cited by examiner

PROCESS FOR FABRICATING SEMICONDUCTOR DEVICE AND METHOD OF FABRICATING METAL OXIDE SEMICONDUCTOR DEVICE

BACKGROUND OF THE INVENTION

1. Field of Invention

This invention relates to a process for fabricating a semiconductive device and a method of fabricating a metal-oxide-semiconductor (MOS) device.

2. Description of Related Art

With the development in the ultra-large scale IC industry, the device is gradually miniaturized, and the gate linewidth and gate dielectric thickness are gradually reduced. Silicon oxide is the most popular material for gate dielectric, but has therein pin holes easily causing electrical issues like direct tunneling current and is therefore difficult to be made into a thin gate dielectric layer.

A gate dielectric layer formed as a silicon oxide layer can be doped with nitrogen to reduce current leakage and improve the device reliability. However, the nitrogen atoms easily diffuse to the interface between the substrate and the gate dielectric layer and reduce the performance and reliability of the device.

SUMMARY OF THE INVENTION

Accordingly, this invention provides a process for fabricating a semiconductor device, whereby a SiON layer is formed with a sufficient nitrogen concentration and a higher dielectric constant (k-value) and thus has improved electrical performance.

This invention also provides a method of fabricating a MOS device, wherein the SiON layer formed has a sufficient nitrogen concentration and a higher k-value so that the MOS device has a higher performance.

The process for fabricating a semiconductor device of this invention is described as follows. A silicon oxide layer is formed. A nitridation process including at least two steps is performed to nitridate the silicon oxide layer into a SiON layer. The nitridation process includes a first nitridation step and a second nitridation step in sequence, wherein the first nitridation step and the second nitridation step are different in the setting of at least one parameter.

The method of fabricating a MOS device of this invention includes performing the above process to form a SiON layer and forming a gate conductive layer thereon.

In some embodiments, the first nitridation step and the second nitridation step each comprise decoupled-plasma nitridation, remote plasma nitridation, or NH$_3$ thermal nitridation.

In some embodiments, the electric power of the first nitridation step is higher than that of the second nitridation step. In such cases, the time period of the second nitridation step may be longer than that of the first nitridation step. The duty cycle of the first nitridation step may be larger than that of the second nitridation step.

In some embodiments, the electric power of the first nitridation step is lower than that of the second nitridation step. In such cases, the time period of the first nitridation step may be longer than that of the second nitridation step. The duty cycle of the second nitridation step may be larger than a duty cycle of the first nitridation step.

In some embodiments, forming the silicon oxide layer includes an in-situ steam generation (ISSG) oxidation process, a chemical vapor deposition (CVD) process or a decoupled plasma oxidation process.

In some embodiments, the above process or method of this invention further includes post-annealing process. The post-annealing process may include a nitrogen gas annealing step and an oxygen gas annealing step in sequence.

By nitridating the silicon oxide layer with a nitridation process including at least two steps, the resulting SiON layer has a sufficient nitrogen concentration to improve its electrical performance, and a MOS device including the SiON layer as a gate dielectric layer can have a good performance.

In order to make the aforementioned and other objects, features and advantages of the present invention comprehensible, a preferred embodiment accompanied with figures is described in detail below.

DESCRIPTION OF EMBODIMENTS

It is noted that the following embodiment is intended to further explain this invention but not to limit the scope of this invention.

Figure 1:
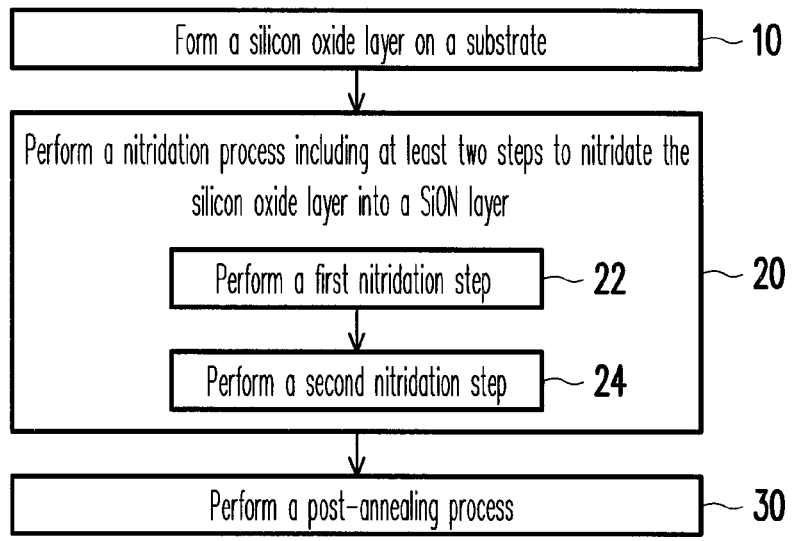
FIG. 1 illustrates the flow chart of a process for fabricating a semiconductor device according to an embodiment of this invention.
Figure 2:
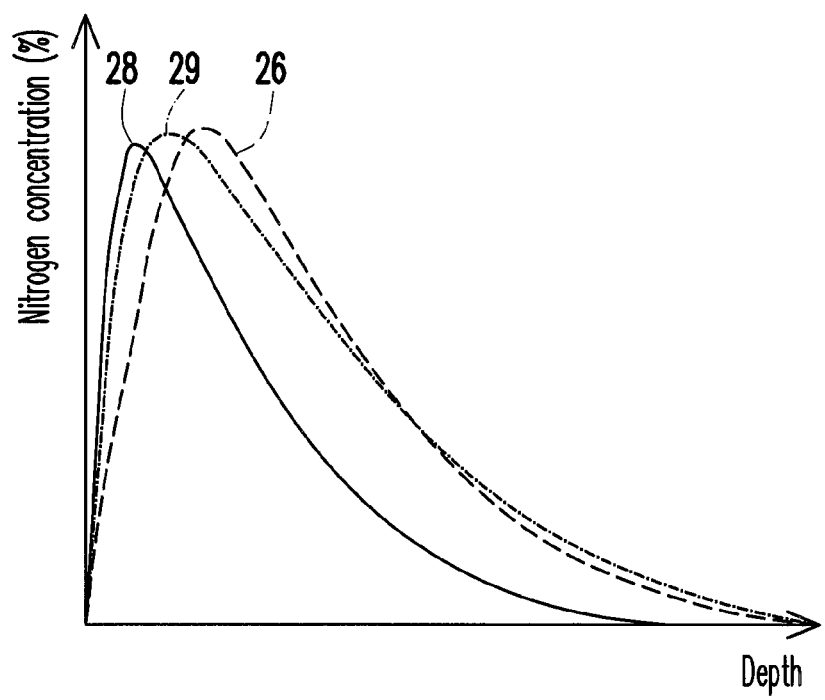
FIG. 2 illustrates the variation of the nitrogen concentration with the depth for a SiON layer formed according to an example of this invention.

FIG. 1 illustrates the flow chart of a process for fabricating a semiconductor device according to an embodiment of this invention. FIG. 2 illustrates the variation of the nitrogen concentration with the depth for a SiON layer formed according to an example of this invention.

Referring to FIG. 1, the fabricating process includes steps 10, 20 and 30. The step 10 is to form a silicon oxide layer on a substrate. The substrate may include a semiconductor element like Si, a semiconductor alloy like SiGe, or a semiconductor on insulator (SOI). The silicon oxide layer may be formed by an in-situ steam generation (ISSG) oxidation process, a chemical vapor deposition (CVD) process or a decoupled plasma oxidation process. The thickness of the silicon oxide layer may range from 1.68 nm to 1.76 nm. If the thickness is overly large, the performance of the silicon oxide layer is lowered. If the thickness is overly small, the silicon oxide layer suffers from nitrogen penetration in the subsequent nitridation process.

The step 20 is to perform a nitridation process including at least two steps to nitridate the above silicon oxide layer. The atomic percentage of nitrogen in the SiON layer formed may range from 20% to 25%. The nitridation process includes a first nitridation step 22 and a second nitridation step 24 in sequence, wherein the nitridation step 22 and the second nitridation step 24 are different in the setting of at least one parameter. The at least one parameter may include electric power, duration, duty cycle, chamber pressure, and/or N$_2$ flow rate. The nitridation process may utilize decoupled-plasma nitridation, remote plasma nitridation, or NH$_3$ thermal nitridation. The decoupled-plasma nitridation process may be a chamber decoupled-plasma nitridation process, a remote decoupled-plasma nitridation process, or a NH$_3$ thermal decoupled-plasma nitridation process.

In some embodiments, each of the first nitridation step 22 and the second nitridation step 24 includes a decoupled-plasma nitridation process, and the first nitridation step 22 is different from the second nitridation step 24 in the electric power, duration and/or duty cycle. In an exemplary embodiment, the electric power of the first nitridation step 22 is higher than that of the second nitridation step 24, the duration of the second nitridation step 24 is longer than that of the first nitridation step 22, and the duty cycle of the first nitridation step 22 is larger than that of the second nitridation step 24. More specifically, it is possible that the first nitridation step 22 sets a pressure of 200 mTorr, a power of 2200 W, a duty cycle larger than 20% and a duration of 30 seconds, and the second nitridation step 24 sets a pressure of 200 mTorr, a power of 2000 W, a duty cycle of 20% and a duration of 60 seconds.

Though the nitridation process includes two nitridation steps in this embodiment, it may alternatively include more than two nitridation steps in other embodiments.

Referring to the depth-nitrogen concentration relationship shown in FIG. 2, the first nitridation step 22 sets a higher power so that the peak of the resulting nitrogen concentration profile 26 is farther away from the top surface of the silicon oxide, and sets a shorter duration so that nitrogen penetration through the silicon oxide is prevented or reduced. Meanwhile, the second nitridation step 24 sets a lower power and a longer duration so that more sufficient nitrogen atoms are provided closer to the top surface of the silicon oxide, as indicated by the corresponding nitrogen concentration profile 28. The combination of the first nitridation step 22 and the second nitridation step 24 produces a nitrogen concentration profile 29 for the resulting SiON layer.

In another exemplary embodiment, each of the first nitridation step 22 and the second nitridation step 24 includes a decoupled-plasma nitridation process, the electric power of the first nitridation step 22 is lower than that of the second nitridation step 24, the duration of the second nitridation step 24 is shorter than that of the first nitridation step 22, and the duty cycle of the first nitridation step 22 is smaller than that of the second nitridation step 24. More specifically, it is possible that the first nitridation step 22 sets a pressure of 200 mTorr, a power of 2000 W, a duty cycle of 20% and a duration of 60 seconds, and the second nitridation step 24 sets a pressure of 200 mTorr, a power of 2200 W, a duty cycle larger than 20% and a duration of 30 seconds.

Referring to the depth-nitrogen concentration relationship shown in FIG. 2, the first nitridation step 22 sets a lower power and a longer duration so that more sufficient nitrogen atoms are provided closer to the top surface of the silicon oxide, as indicated by the resulting nitrogen concentration profile 28. Meanwhile, the second nitridation step 24 sets a higher power so that the peak of the resulting nitrogen concentration profile 26 is farther away from the top surface of the silicon oxide, and sets a shorter duration so that nitrogen penetration through the silicon oxide is prevented or reduced. The combination of the first nitridation step 22 and the second nitridation step 24 produces a nitrogen concentration profile 29 for the resulting SiON layer.

The step 30 is to perform a post-annealing process, which may include a nitrogen gas annealing step and an oxygen gas annealing step. The N$_2$-annealing step may be a rapid thermal annealing (RTA) step, a UV annealing step or a laser annealing step. The O$_2$-annealing step may be a rapid thermal annealing (RTA) step, a UV annealing step or a laser annealing step. In an embodiment, the N$_2$-annealing step may be a RTA step, possibly performed at a temperature of 800° C. and possibly performed for 10-120 seconds. The O$_2$-annealing step may be a RTA step, possibly performed at a temperature of 600° C. and possibly performed for 10-120 seconds.

Figure 3:
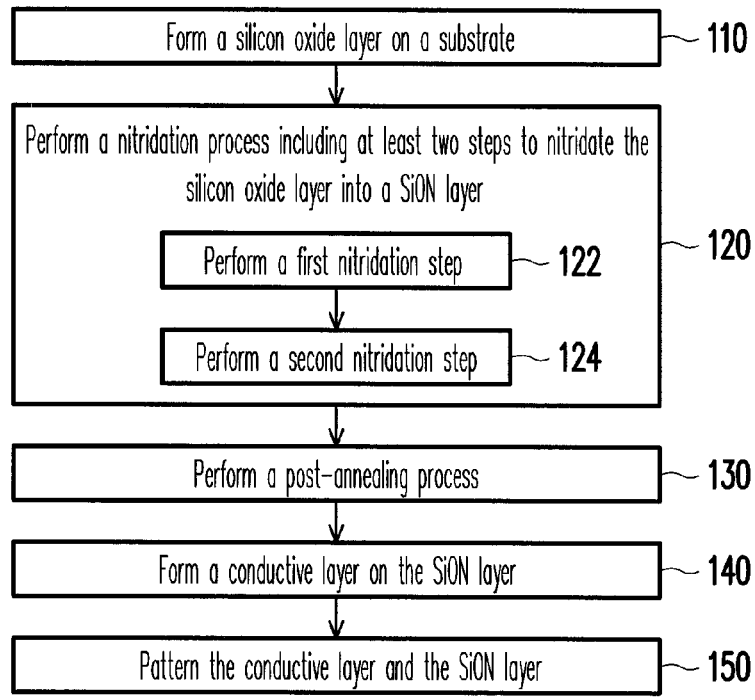
FIG. 3 illustrates the process flow of a method of fabricating a MOS device according to an embodiment of this invention.
Figure 4A:
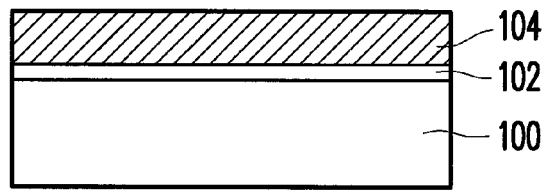
FIGS. 4A-4B illustrate, in a cross-sectional view, a method of fabricating a MOS device according to the embodiment of this invention.
Figure 4B:
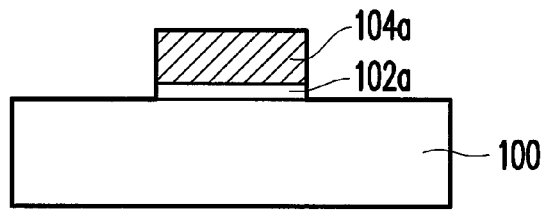

FIG. 3 illustrates the process flow of a method of fabricating a MOS device according to an embodiment of this invention. FIGS. 4A-4B illustrate, in a cross-sectional view, a method of fabricating a MOS device according to the embodiment of this invention.

Referring to FIGS. 3 & 4A, the method of fabricating a MOS device includes steps 110, 120, 130, 140 and 150, wherein the steps 110, 120 (122+124) and 130 are similar to the above-mentioned steps 10, 20 (22+24) and 30 for forming a SiON layer 202 on the substrate 200 and are not described again.

Referring to FIGS. 3 & 4A, the step 140 is to form a conductive layer 204 on the SiON layer 202. The conductive layer 204 may include doped polysilicon, metal and a combination thereof. The conductive layer 204 may be formed through CVD. In an embodiment, the conductive layer 204 includes doped polysilicon and may be formed by a CVD process using disilane as a reaction gas. The thickness of the deposited doped polysilicon layer may range from 400 angstroms to 900 angstroms.

Referring to FIGS. 3 & 4B, the step 150 is to pattern the conductive layer 204 and the SiON layer 202 and thus form a patterned conductive layer 204a and a patterned SiON layer 202a. The conductive layer 204 and the SiON layer 202 may be patterned through a lithography process and an etching process. The patterned conductive layer 204a serves a gate conductor while the patterned SiON layer 202a serves a gate dielectric layer.

By nitridating the silicon oxide layer with a nitridation process including at least two steps, the resulting SiON layer has a sufficient nitrogen concentration to improve its electrical performance. Moreover, since such a SiON layer has an improved electrical performance, a MOS device including such a SiON layer as a gate dielectric layer can have a good performance.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:
1. A process for fabricating a semiconductor device, comprising:
   forming a silicon oxide layer, wherein forming the silicon oxide layer comprises an in-situ steam generation (ISSG) oxidation process or a decoupled plasma oxidation process; and
   performing a nitridation process including at least two steps to nitridate the silicon oxide layer into a silicon oxynitride (SiON) layer, wherein the nitridation process comprises a first nitridation step and a second nitridation step, and the first nitridation step and the second nitridation step are different in setting of at least one parameter,
   wherein the first nitridation step and the second nitridation step each comprises remote plasma nitridation, or NH$_3$ thermal nitridation;
   the electric power of the first nitridation step is higher than the electric power of the second nitridation step, so that a peak of the resulting nitrogen concentration profile from the first nitridation step is farther away from a top surface of the silicon oxide layer, and nitrogen atoms provided by the second nitridation step are closer to the top surface of the silicon oxide layer; and a time period of the second nitridation step is longer than a time period of the first nitridation step, so that nitrogen penetration through the silicon oxide layer is prevented or reduced during the first nitridation step.

2. The process of claim 1, wherein the first nitridation step is performed before the second nitridation step.

3. The process of claim 1, wherein a duty cycle of the first nitridation step is larger than a duty cycle of the second nitridation step.

4. The process of claim 1, wherein the first nitridation step is performed after the second nitridation step.

5. The process of claim 1, further comprising a post-annealing process.

6. The process of claim 5, wherein the post-annealing process comprises a nitrogen gas annealing step and an oxygen gas annealing step in sequence.

7. A method of fabricating a MOS device, comprising:

forming a silicon oxide layer, wherein forming the silicon oxide layer comprises an in-situ steam generation (ISSG) oxidation process or a decoupled plasma oxidation process;

performing a nitridation process including at least two steps to nitridate the silicon oxide layer into a SiON layer, wherein the nitridation process comprises a first nitridation step and a second nitridation step, and the first nitridation step and the second nitridation step are different in setting of at least one parameter, wherein the first nitridation step and the second nitridation step each comprises remote plasma nitridation, or $NH_3$ thermal nitridation;

the electric power of the first nitridation step is higher than the electric power of the second nitridation step, so that a peak of the resulting nitrogen concentration profile from the first nitridation step is farther away from a top surface of the silicon oxide layer, and nitrogen atoms provided by the second nitridation step are closer to the top surface of the silicon oxide layer, a time period of the second nitridation step is longer than a time period of the first nitridation step, so that nitrogen penetration through the silicon oxide layer is prevented or reduced during the first nitridation step; and forming a conductive layer on the SiON layer.

8. The method of claim 7, wherein the first nitridation step is performed before the second nitridation step.

9. The method of claim 7, wherein a duty cycle of the first nitridation step is larger than a duty cycle of the second nitridation step.

10. The method of claim 7, wherein the first nitridation step is performed after the second nitridation step.

11. The method of claim 7, further comprising a post-annealing process.

12. The method of claim 11, wherein the post-annealing process comprises a nitrogen gas annealing step and an oxygen gas annealing step in sequence.

* * * * *